United States Patent [19]
Harshfield

[11] Patent Number: 5,379,250
[45] Date of Patent: Jan. 3, 1995

[54] ZENER PROGRAMMABLE READ ONLY MEMORY

[75] Inventor: Steven T. Harshfield, Emmett, Id.

[73] Assignee: Micron Semiconductor, Inc., Boise, Id.

[21] Appl. No.: 110,026

[22] Filed: Aug. 20, 1993

[51] Int. Cl.$^6$ .................... G11C 17/06; H01L 29/90
[52] U.S. Cl. .................... 365/105; 365/96; 365/225.7; 257/529; 257/530
[58] Field of Search .............. 365/105, 96, 225.7; 257/529, 530

[56] References Cited

U.S. PATENT DOCUMENTS

| | | |
|---|---|---|
| 4,598,386 | 7/1986 | Roesner et al. ............ 365/105 |
| 4,881,114 | 11/1989 | Mohsen et al. ............ 257/530 |
| 5,130,777 | 7/1992 | Galbraith et al. .......... 365/225.7 |

FOREIGN PATENT DOCUMENTS

| | | | |
|---|---|---|---|
| 136099 | 7/1985 | Japan ........... | 365/102 |
| 225864 | 10/1991 | Japan ........... | 365/105 |

Primary Examiner—Robert Limanek
Attorney, Agent, or Firm—Ozer M. N. Teitelbaum; William R. Bachand

[57] ABSTRACT

The present invention teaches a memory comprising an array of memory cells. Each cell of the array in the memory comprises a bus, and a diode, preferably a zener diode, having a substantially low breakdown voltage. Further, each cell comprises a programmable element, preferably an antifuse, for selectively coupling the diode with the bus.

15 Claims, 3 Drawing Sheets

ZENER PROGRAMMABLE READ ONLY MEMORY

FIELD OF THE INVENTION

This invention relates to the field of semiconductor devices, and more particularly to programmable read only memories ("PROMs").

BACKGROUND OF THE INVENTION

One time programmable read only memories ("OTPROMs") store individual binary bits of information in memory cells. Given their "read only" nature, once programmed, these memories are essentially limited to being read only devices. At this point, these devices cannot be reprogrammed, and thus, no new information can be entered. To insure the viability of these devices, the binary data stored within the OTPROM is non-volatile. The non-volatility of the data enables the preservation of the data when power is removed.

PROMs comprise a plurality of word lines, and a plurality of parallel bit lines. The bit lines are perpendicular to the word lines and the general area of each intersection of a word line and a bit line, along with any associated circuitry, constitutes a single memory cell. Normally, the presence or absence of a conducting semiconductor device, diode or transistor, connecting the word line and the bit line determines the binary "1" or "0" state of the memory cell. The absence of a conducting semiconductor can result from (1) the absence of a complete transistor or diode, or (2) the presence of a high resistance in series with the semiconductor.

Fundamentally, the absence of a conducting semiconductor can be achieved by several means known in the art. One known approach is usage of fuse-type coupling. By linking the semiconductor through a fuse, the absence of conductivity is achieved when a sufficient voltage is applied so as to disintegrate the fusible link.

Another known strategy has been to employ an antifuse link having a thin dielectric layer. Utilizing this approach, each conducting semiconductor is disassociated with the memory prior to programming. However, by applying appropriate voltages to the antifuse, its dielectric layer can be disabled, thereby allowing the semiconductor to conduct.

Several problems remain with respect to the PROM. Industry demands a PROM cell that can be programmed at high voltages over a shorter period of time. Further, there still remains a need for a PROM cell that can more easily be isolated from the remaining memory array. Moreover, a demand exists for a PROM cell which is more simple to manufacture, and is easier to shrink, overcoming problems in alignment, sizing, and matching materials.

SUMMARY OF THE INVENTION

The primary advantage of the present invention is to eliminate the aforementioned drawbacks of the prior art.

Another object of the present invention is to provide a PROM cell that can be programmed at high voltages over a shorter period of time.

A further object of the present invention is to provide a PROM cell that can more easily be isolated from the remaining memory array.

Still another object of the present invention is to provide a PROM which is simple to manufacture, and is easier to shrink, overcoming problems in alignment, sizing and matching materials.

In order to achieve the advantages of the present invention, a memory is disclosed comprising an array of cells. Each cell of the array in the memory comprises a bus, and a diode, preferably a zener diode, having a substantially low breakdown voltage. Further, each cell comprises a programmable element for selectively coupling the diode with the bus.

In another embodiment, a method is disclosed for programming a programmable read only memory comprising an array of memory cells. Each cell of the array comprises a first and a second bus, and each bus has a predetermined voltage. Furthermore, each cell comprises a zener diode having a breakdown voltage of at most 7 volts, and a programmable antifuse element, comprising a dielectric layer, for selectively coupling the zener diode with the first bus. Given this structure, the method for programming the memory comprises the steps of first selecting a cell from the array to be programmed. Second, the voltage on the first bus is raised. Third, the voltage on the second bus is lowered. Fourth, the dielectric layer of the antifuse element is destroyed by coupling the zener diode with the first bus.

Other aspects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
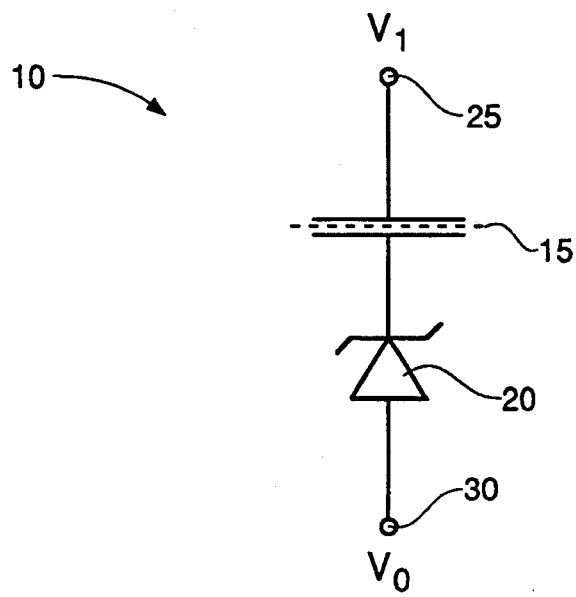
FIG. 1 is a first perspective of the present invention.

Referring to FIG. 1, a first perspective of a diode memory cell 10 is provided. Cell 10 comprises essentially two components. The first element is diode 20. To take full advantage of the present invention disclosed herein, diode 20 comprises a substantially low breakdown voltage. In the preferred embodiment of the present invention, this breakdown voltage is, at most, 7 volts. In this light, diode 20 is preferably a zener diode.

Coupled with diode 20 is the second component, a programmable element 15 for selectively enabling a current to pass through the diode. In one embodiment of the present invention, programmable element 15 comprises a fuse. Using a fuse, an array of memory cells can be programmed by selectively disabling cells to be programmed. This disabling step is achieved by allowing a sufficient reverse current to pass through the diode to cause the fuse to disintegrate. The reverse current is generated by a differential voltage created on two terminals, 25 and 30, each terminal having a voltage, $V_1$ and $V_0$, respectively.

In the preferred embodiment, programmable element 15 comprises an antifuse. An array of memory cells can be programmed in this design by selectively enabling cells to be programmed. An antifuse type programmable element comprises a dielectric layer. Thus, the enabling step is achieved by allowing a sufficient reverse current to pass through the diode to cause the dielectric layer to disintegrate. The reverse current is generated by a differential voltage created on two terminals, 25 and 30, each terminal having a voltage, $V_1$ and $V_0$, respectively.

Figure 2:
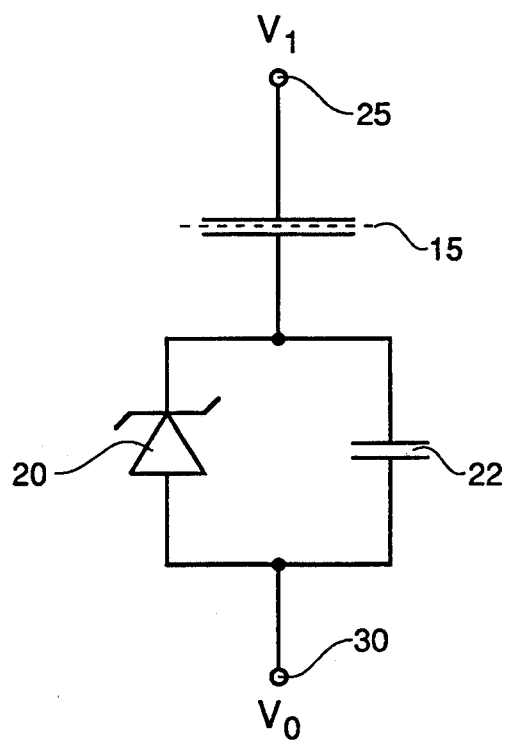
FIG. 2 is a second perspective of the preferred embodiment of the present invention.

The present invention employs the advantages of a voltage divider in forming a PROM cell. Referring to FIG. 2, a second perspective of the preferred embodiment of the present invention is shown. Here, the cell, and more particularly diode 20, is illustrated having an intrinsic, parasitic capacitance 22. The value of capacitance 22 is essential to the operation of the present invention. Capacitance 22 must be substantially less than the capacitance of programmable antifuse 15. By doing so, the voltage distribution created by the differential voltage between terminals 25 and 30 falls substantially over the diode 20 and thus capacitance 22, as opposed to programmable antifuse 15.

The present invention utilizes the advantages of the zener diode in making a PROM cell so as to provide improved electrical isolation. This is in part because zener diodes allow current to pass only at or beyond their breakdown voltages. Thus, very little voltage develops across the antifuse capacitor, due to current leakage, until the zener diode breakdown voltage is reached.

Figure 3:
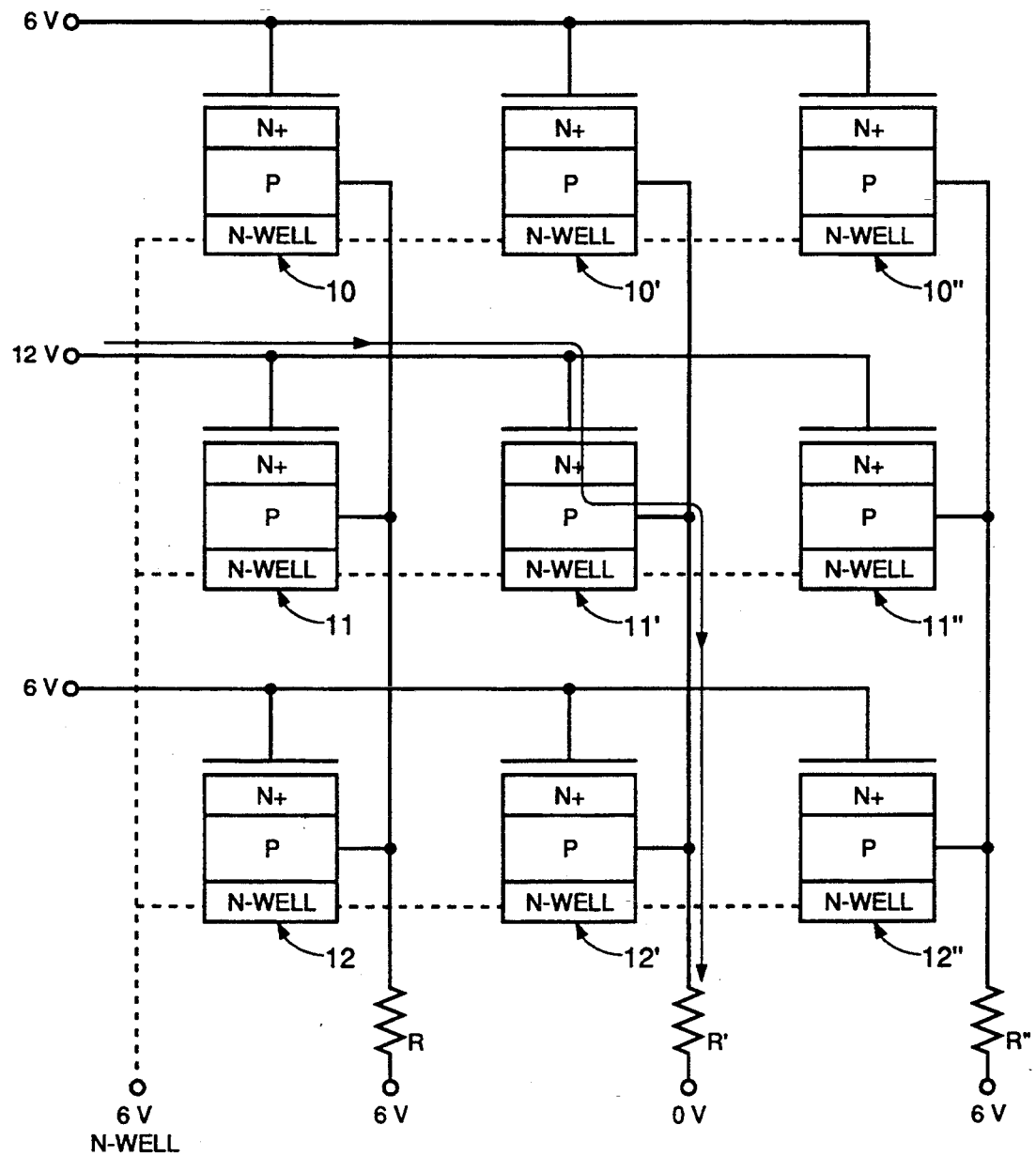
FIG. 3 illustrates a scheme for programming a memory device employing the present invention.

Referring to FIG. 3, a scheme for programming a memory device employing the present invention is illustrated. As shown, the memory device comprises an array of memory cells, 10-10", 11-11", and 12-12", a column biasing bus for each column, and a row biasing bus for each row. Further, each column biasing bus comprises a biasing resistance, R-R". Biasing resistance, R-R", can comprise any resistive element, such as a resistor, transistor, as well as any other active element. In one embodiment of the present invention, a decoder is also employed for accessing each cell of the array.

Each cell comprises an N well formed on a substrate (not shown) which is coupled to a biasing bus. Formed superjacent each N well is diode 20. To this end, a P doped layer is disposed on each N well, while an N+ doped layer is formed on each P doped layer. Moreover, programmable antifuse layer 15 is disposed on the N+ doped layer.

Furthermore, each P doped layer, as well as each N well are biased at a predetermined voltage. This is achieved by coupling each P doped layer and each N well to voltage biasing buses. To facilitate the memory's operation, each P doped layer bus comprises an independent biasing bus, while, in contrast, each N well is coupled to one biasing bus. Further, each antifuse is coupled to an independent bus biased at a predetermined voltage. This format naturally lends itself to a matrix type configuration, whereby the array of cells are defined by a number of rows and a number of columns. Utilizing this scheme, each programmable antifuse layer 15 of a row of cells is potentially coupled to a first biasing bus. Moreover, each P doped layer of a column of cells is coupled to a second biasing bus.

The value of the biasing voltage applied to each bus directly corresponds to the mode of the memory's operation. With respect to the programming mode, the N wells are biased at a predetermined voltage, preferably 6 volts. Those cells which are to be programmed using a sufficient reverse current are biased differently, however, than those which are not to be programmed.

Thus, a selected cell can be programmed by applying a high voltage on a first biasing (row) bus and a low biasing voltage on a second biasing (column) bus. Moreover, these selected cells receive the full programming voltage derived from the biasing buses across their nodes. By this arrangement, the antifuse of each selected cell receives half the voltage across its dielectric layer to cause antifuse programming, with the remaining half falling across the zener diode.

In contrast, unselected cells, which have not been previously programmed, resist programming due to the voltage divider described herein. Unselected cells have at most half the programming voltage. Of this half, the antifuse layer of the unselected and previously unprogrammed cells receives at most one sixth of the programming voltage because the large voltage drop across the smaller zener diode junction capacitance.

Further, unselected cells, including those previously programmed, as well as those unprogrammed, can resist leaking current away from those cells being programmed. Given their reverse biased arrangement, these cells inherently resist leaking current away. This point is supported by the fact that during programming, unselected cells have approximately half the programming voltages derived from the biasing buses across their nodes.

In the preferred embodiment, the voltage of the first biasing bus is set at approximately 12 volts. This enables the antifuses of a row of cells of the array to be biased at 12 volts. Further, the second biasing bus is set preferably at approximately 0 volts. This second bus biases each P doped layer along a column of cells. Thus, selecting these voltages allows the dielectric layer of the antifuse of a selected cell to be sufficiently disintegrated. Further, the inherent column resistance in series with biasing resistance R' limits the current flow through the programming cells and consequently preserves the programming voltage on the row line.

By establishing these programming biasing voltages, an isolated reverse current $I_p$ passes through selected cell 11' in order to destroy its antifuse. It should be noted that while $I_p$ passes through cell 11', because the remaining cells in the matrix array are biased differently, only the antifuse of cell 11' is programmed. In this light, the antifuse and the P doped layers of cells of the memory array not associated with the row or column of cell 11' have a biasing voltage of preferably 6 volts and 6 volts, respectively. Further, those unselected cells in the row of the selected cell 11' have an antifuse bias of preferably 12 volts and a P doped bias of 6 volts. Those unselected cells in the column of the selected cell 11' have an antifuse bias of preferably 6 volts and a P doped bias of 0 volts. Thus, those cells that are not selected for programming, given the inherent characteristics of the zener diode and the biasing voltages described herein, are protected from enabling a sufficient reverse current $I_p$ to pass and from programming unwanted cells. This is supported by the fact that during programming, the zener diodes of the selected cells isolate the remaining unselected cells of the same column from the row line voltage, by limiting the maximum column voltage rise to one half of the programming voltage.

Given this design, one embodiment of the present invention comprises a method for programming the array of memory cells employing zener diodes. Initially, a cell of the array is selected to be programmed. Subsequently, the voltage on a first bus is raised to preferably 12 volts, while the voltage on a second bus is lowered to preferably 0 volts. In one embodiment, the step of raising and the step of lowering are performed substantially simultaneously. This can be achieved by charging up both first and second buses to approximately 6 volts prior to selecting the cell to be programmed. In this light, the raised voltage on the first bus and the lowered voltage on the second bus are held for a predetermined period of time to provide an opportunity to destroy the selected cell's antifuse. In the preferred embodiment, this holding period is approximately 5 $\mu$seconds. Next, the zener diode is coupled with the first bus by destroying the dielectric layer of the antifuse of the cell.

Figure 4:
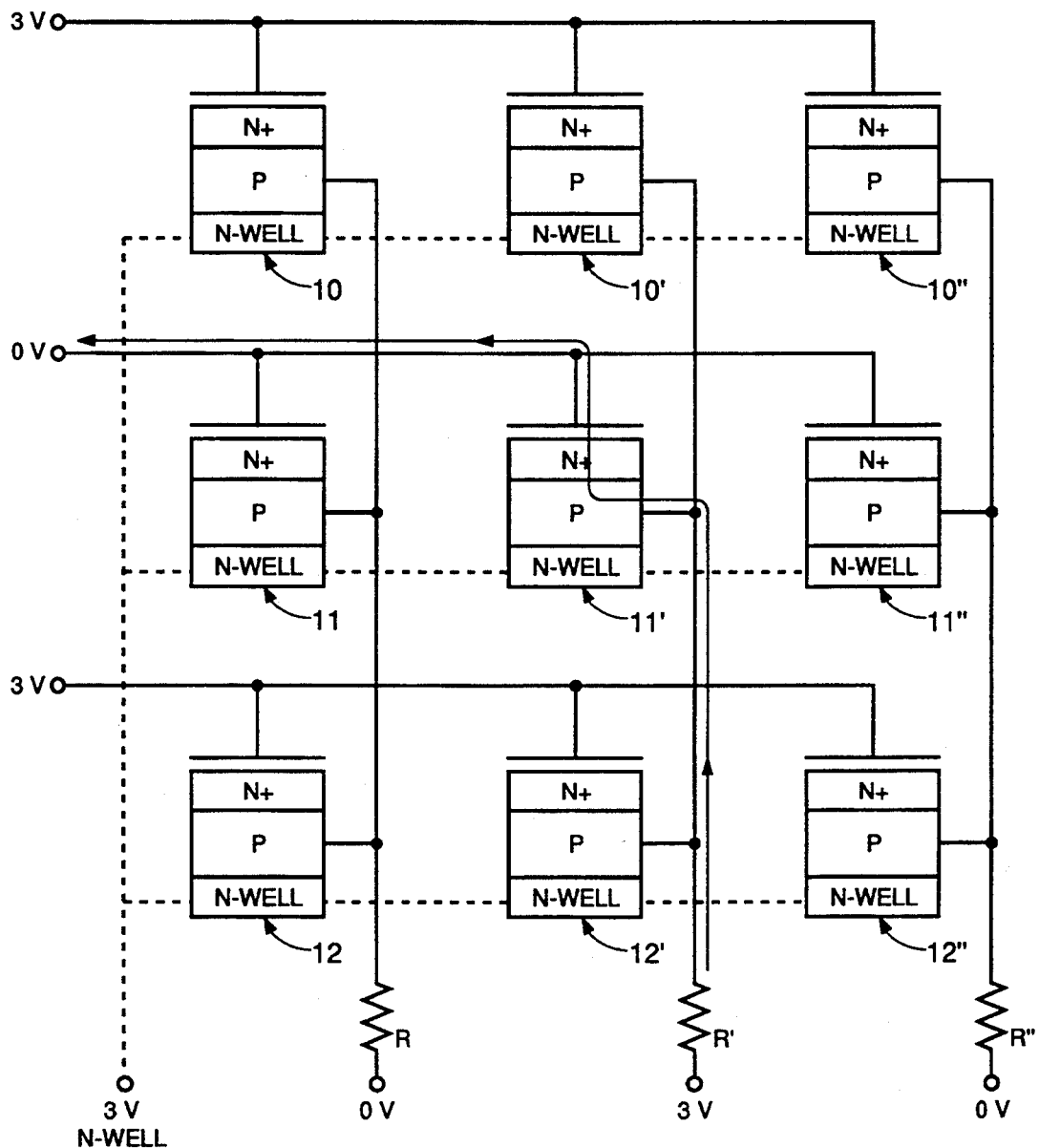
FIG. 4 illustrates a scheme for reading data from a memory device employing the present invention.

Referring to FIG. 4, a scheme for reading data from a memory device employing the present invention is depicted. As described hereinabove, the memory device comprises an array of memory cells, 10–10", 11–11", and 12–12", a column biasing bus for each column, and a row biasing bus for each row. Further, each column biasing bus comprises a biasing resistance, R–R". Biasing resistance, R–R", can comprise any resistive element, such as a resistor, transistor, as well as any other active element. In one embodiment of the present invention, a decoder is also employed for accessing each cell of the array.

Each cell comprises an N well formed on a substrate (not shown) which is coupled to a biasing bus. Further, formed superjacent each N well is a diode 20. Diode 20 comprises a P doped layer disposed on each N well and an N+ doped layer is formed on each P doped layer. Further, a programmable antifuse layer 15 is disposed on the N+ doped layer of each cell.

Furthermore, the P doped layer of each cell in the memory device, as well as each N well are biased at a predetermined voltage. This is achieved by coupling each P doped layer and each N well to voltage biasing buses. To facilitate the memory's operation, each P doped layer bus comprises an independent biasing bus, while, in contrast, each N well is coupled to one biasing bus. This format naturally lends itself to a matrix type configuration, whereby the array of cells are defined by a number of rows and a number of columns. Utilizing this scheme, each programmable antifuse layer 15 is coupled to a first biasing bus. Moreover, each P doped layer of a column of cells is coupled to a second biasing bus.

The value of the biasing voltage applied to each bus directly corresponds to the mode of the memory's operation. With respect to the reading mode, the N wells are biased at a predetermined voltage, preferably 3 volts. Further, those cells which are to be read from using a sufficient forward current are biased differently than those which are not to be read. A selected cell, thus, can be read from by applying a lower voltage on a first biasing (row) bus and a higher biasing voltage on a second biasing (column) bus.

In the preferred embodiment, the voltage of the first biasing bus is set at approximately 0 volts. Further, the second biasing bus is set preferably at approximately 3 volts. By establishing these biasing voltages, a forward read current $I_r$ passes through cell 11'. It should be noted that $I_r$ passes through only cell 11', given that the remaining cells in the matrix array are biased differently and the inherent characteristics of the zener diode. In this light, the first and second buses of cells of the memory array not associated with the row or column of cell 11' have a biasing voltage of preferably 3 volts and 0 volts, respectively. Further, those unselected cells in the row of the selected cell 11' have a row bias of preferably 0 volts and a column bias of 0 volts. Those unselected cells in the column of the selected cell 11' have a row bias of preferably 3 volts and a column bias of 3 volts.

In an alternate embodiment, the array of memory cells are read with a high biasing voltages. Here, once all row and column biasing buses are set to a predetermined voltage, such as 6 volts, a first row is raised to higher voltage, such as 9 volts, while all interrogating column lines are lowered to a lower voltage, such as 0 volts. For proper operation, the differential voltage across the interrogated cells must be greater than the breakdown voltage of the zener diode employed. Nonetheless, the differential voltage must be less than the cell programming voltage. Further, relying on this point, no less than half the voltage differential must be applied by the column line. Thus, all unselected cells are isolated in the same manner as that taken during high voltage programming.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. For example, while an aspect of the present invention pertains to programmable read only memories, its benefits can be applied to any integrated circuit requiring programmable circuitry. Thus, the present invention could be employed in a programmable logic array. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. An integrated circuit comprising:
   a. a programmable memory cell comprising:
      (1) a diode for conducting a reverse current when reverse biased and for conducting a forward current when forward biased; and
      (2) an antifuse coupled in series with the diode, the antifuse being programmed by the reverse current; and
   b. reading means coupled to the cell, the reading means in operation forward biasing the diode so that operation of the integrated circuit is responsive to a portion of the forward current flowing through the antifuse.

2. The integrated circuit of claim 1 wherein the diode comprises a zener diode.

3. The integrated circuit of claim 2 wherein the zener diode is characterized by a zener voltage of less than seven volts.

4. The integrated circuit of claim 1 wherein the diode is characterized by a reverse breakdown voltage of less than seven volts.

5. The integrated circuit of claim 1 wherein the diode is characterized by a first capacitance; and the antifuse is characterized by a second capacitance, the second capacitance being greater than the first capacitance.

6. An integrated circuit comprising:
   a. a programmable memory cell comprising:
      (1) a diode for conducting a reverse current when reverse biased and for conducting a forward current when forward biased; and
      (2) a fuse coupled in series with the diode, the fuse being programmed by the reverse current; and
   b. reading means coupled to the cell, the reading means in operation forward biasing the diode so that operation of the integrated circuit is responsive to a lack of forward current flowing through the fuse.

7. The integrated circuit of claim 6 wherein the diode comprises a zener diode.

8. The integrated circuit of claim 7 wherein the zener diode is characterized by a zener voltage of less than seven volts.

9. The integrated circuit of claim 6 wherein the diode is characterized by a reverse breakdown voltage of less than seven volts.

10. The integrated circuit of claim 6 wherein the diode is characterized by a first capacitance; and the antifuse is characterized by a second capacitance, the second capacitance being greater than the first capacitance.

11. A programmable logic array responsive to an input and providing an output, the array comprising:
   a. a diode for conducting a reverse current when reverse biased and for conducting a forward current when forward biased;
   b. an antifuse coupled in series with the diode, the antifuse being programmed by the reverse current; and
   c. a circuit for providing the output responsive to the input, the circuit in operation forward biasing the diode so that the output is provided further responsive to a portion of the forward current flowing through the antifuse.

12. The integrated circuit of claim 11 wherein the diode comprises a zener diode.

13. The integrated circuit of claim 12 wherein the zener diode is characterized by a zener voltage of less than seven volts.

14. The integrated circuit of claim 11 wherein the diode is characterized by a reverse breakdown voltage of less than seven volts.

15. The integrated circuit of claim 11 wherein the diode is characterized by a first capacitance; and the antifuse is characterized by a second capacitance, the second capacitance being greater than the first capacitance.

* * * * *